(12) United States Patent
Jeong et al.

(10) Patent No.: US 10,699,846 B2
(45) Date of Patent: Jun. 30, 2020

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Dae Heon Jeong, Suwon-si (KR); Young Ghyu Ahn, Suwon-si (KR); Ho Yoon Kim, Suwon-si (KR); Man Su Byun, Suwon-si (KR); Soo Hwan Son, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 8 days.

(21) Appl. No.: 15/994,871

(22) Filed: May 31, 2018

(65) Prior Publication Data
US 2019/0066918 A1 Feb. 28, 2019

(30) Foreign Application Priority Data

Aug. 28, 2017 (KR) ........................ 10-2017-0108646

(51) Int. Cl.
*H01G 4/12* (2006.01)
*H01G 4/30* (2006.01)
(Continued)

(52) U.S. Cl.
CPC ................. *H01G 4/12* (2013.01); *H01G 2/06* (2013.01); *H01G 2/065* (2013.01); *H01G 4/005* (2013.01);
(Continued)

(58) Field of Classification Search
CPC ............ H01G 4/12; H01G 2/06; H01G 2/065; H01G 4/005; H01G 4/012; H01G 4/232;
(Continued)

(56) References Cited

U.S. PATENT DOCUMENTS

2011/0228443 A1 9/2011 Nishimura et al.
2013/0284507 A1 10/2013 Hattori et al.
(Continued)

FOREIGN PATENT DOCUMENTS

CN 102199037 A 9/2011
CN 104064355 A 9/2014
(Continued)

OTHER PUBLICATIONS

Korean Office Action dated Sep. 18, 2018 issued in Korean Patent Application No. 10-2017-0108646 (with English translation).
(Continued)

*Primary Examiner* — Michael P McFadden
(74) *Attorney, Agent, or Firm* — Morgan, Lewis & Bockius LLP

(57) ABSTRACT

A composite electronic component includes a composite body in which a multilayer ceramic capacitor and a ceramic chip are coupled to each other, the multilayer ceramic capacitor including a body having internal electrodes stacked to face each other and a plurality of dielectric layers interposed therebetween, and first and second external electrodes disposed on both end portions of the body, and the ceramic chip being disposed on a lower portion of the multilayer ceramic capacitor, wherein the ceramic chip has a double-step shape and includes two ceramic chips having different lengths to each other and coupled in a thickness direction of the ceramic chip.

14 Claims, 12 Drawing Sheets

(51) Int. Cl.
| | |
|---|---|
| *H01G 2/06* | (2006.01) |
| *H01G 4/005* | (2006.01) |
| *H05K 1/02* | (2006.01) |
| *H05K 3/34* | (2006.01) |
| *H01G 4/38* | (2006.01) |
| *H01G 4/232* | (2006.01) |
| *H01G 4/012* | (2006.01) |

(52) U.S. Cl.
CPC ............ *H01G 4/012* (2013.01); *H01G 4/232* (2013.01); *H01G 4/30* (2013.01); *H01G 4/38* (2013.01); *H05K 1/0271* (2013.01); *H05K 3/3442* (2013.01); *H05K 2201/10015* (2013.01); *H05K 2201/1053* (2013.01); *H05K 2201/10515* (2013.01)

(58) Field of Classification Search
CPC .. H01G 4/30; H01G 4/38; H01G 4/40; H05K 1/182
USPC ............................................ 361/301.4, 321.2
See application file for complete search history.

(56) References Cited

U.S. PATENT DOCUMENTS

| | | |
|---|---|---|
| 2014/0268487 A1 | 9/2014 | Yoshida |
| 2014/0284089 A1 | 9/2014 | Hattori et al. |
| 2015/0026972 A1 | 1/2015 | Ogawa et al. |
| 2015/0270068 A1* | 9/2015 | Hattori ..................... H01G 4/30 361/301.4 |
| 2016/0133386 A1 | 5/2016 | Park et al. |
| 2016/0309578 A1 | 10/2016 | Park |
| 2017/0105283 A1 | 4/2017 | Kim et al. |

FOREIGN PATENT DOCUMENTS

| | | |
|---|---|---|
| JP | H06-333773 A | 2/1994 |
| JP | H07-106144 A | 4/1995 |
| JP | H07-111380 A | 4/1995 |
| JP | H07-037747 A | 7/1995 |
| JP | H09-266125 A | 7/1997 |
| JP | H09-326326 A | 12/1997 |
| JP | 2001-267734 A | 9/2001 |
| JP | 2004-014687 A | 1/2004 |
| JP | 5012658 B2 | 8/2012 |
| JP | 2014-027085 A | 2/2014 |
| JP | 2014-036149 A | 2/2014 |
| JP | 2014-179512 A | 9/2014 |
| JP | 2014-207422 A | 10/2014 |
| JP | 2015-023246 A | 2/2015 |
| JP | 2015-509659 A | 3/2015 |
| JP | 2015-185652 A | 10/2015 |
| JP | 2016-208003 A | 12/2016 |
| JP | 2017-059573 A | 3/2017 |
| KR | 10-2016-0055424 A | 5/2016 |
| KR | 10-2017-0042958 A | 4/2017 |
| WO | 2012/090986 A1 | 7/2012 |
| WO | 2013/119471 A1 | 8/2013 |

OTHER PUBLICATIONS

Japanese Office Action dated Oct. 30, 2018 issued in Japanese Patent Application No. 2018-106679 (with English translation).
First Office Action dated Mar. 3, 2020 in Chinese Patent Application No. 201810928970.6 (With English Abstract).

* cited by examiner

I-I'

I-I'

COMPOSITE ELECTRONIC COMPONENT AND BOARD HAVING THE SAME

CROSS-REFERENCE TO RELATED APPLICATION(S)

This application is based on and claims the benefit of priority to Korean Patent Application No. 10-2017-0108646 filed on Aug. 28, 2017 in the Korean Intellectual Property Office, the entire disclosure of which is incorporated herein by reference.

TECHNICAL FIELD

The present disclosure relates to a composite electronic component and a board having the same.

BACKGROUND

A multilayer ceramic capacitor, a multilayer electronic component, is a chip type condenser mounted on the circuit boards of various electronic products, including display devices such as liquid crystal displays (LCDs), plasma display panels (PDPs), and the like, computers, personal digital assistants (PDAs), mobile phones, and the like, serving to charge or discharge electricity.

This multilayer ceramic capacitor (MLCC) may be used as a component in various electronic apparatuses due to advantages thereof such as a small size, high capacitance, and ease of mountability.

The multilayer ceramic capacitor may have a structure in which a plurality of dielectric layers and internal electrodes disposed between the dielectric layers and having different polarities are alternately stacked.

Since the dielectric layer as described above has piezoelectricity and electrostriction, when a direct current (DC) or alternating current (AC) voltage is applied to the multilayer ceramic capacitor, a piezoelectric phenomenon may occur between the internal electrodes, thereby generating vibrations.

These vibrations are transferred to a circuit board on which the multilayer ceramic capacitor is mounted through external electrodes of the multilayer ceramic capacitor, such that an entire circuit board becomes a sound reflecting surface to transmit the sound of vibrations as noise.

The sound of vibrations may correspond to an audio frequency within a range of 20 to 20,000 Hz potentially causing user discomfort. The vibration noise causing listener discomfort as described above is known as acoustic noise.

In accordance with the recent trend for slimness and miniaturization of electronic devices, the multilayer ceramic capacitor has been used together with a printed circuit board in high voltage and large voltage change environments, and thus, such acoustic noise may be experienced by a user.

Therefore, a novel product capable of reducing acoustic noise has been continuously demanded.

Meanwhile, research into a composite electronic component in which a printed circuit board is used below a multilayer ceramic capacitor in order to reduce acoustic noise has been conducted.

However, in a case of increasing a thickness of the circuit board, an effect of reducing acoustic noise may be increased, but a side effect of decreasing electrical properties may occur. Therefore, research into a technology capable of efficiently reducing acoustic noise while significantly decreasing the thickness of the circuit board has been required.

SUMMARY

An aspect of the present disclosure may provide a composite electronic component capable of efficiently reducing acoustic noise, and a board having the same.

According to an aspect of the present disclosure, a composite electronic component may include a composite body in which a multilayer ceramic capacitor and a ceramic chip are coupled to each other, the multilayer ceramic capacitor including a body having internal electrodes stacked to face each other and a plurality of dielectric layers each interposed therebetween, and first and second external electrodes disposed on both end portions of the body, and the ceramic chip being disposed on a lower portion of the multilayer ceramic capacitor, wherein the ceramic chip has a double-step shape and includes two ceramic chips having different lengths to each other coupled in a thickness direction of the ceramic chip.

According to another aspect of the present disclosure, a composite electronic component may include a composite body in which a multilayer ceramic capacitor and a ceramic chip are coupled to each other, the multilayer ceramic capacitor including a body having internal electrodes stacked to face each other and a plurality of dielectric layers each interposed therebetween, and first and second external electrodes disposed on both end portions of the body, and the ceramic chip being disposed on a lower portion of the multilayer ceramic capacitor, wherein the ceramic chip has a length shorter than that of the multilayer ceramic capacitor.

According to another aspect of the present disclosure, a board having a composite electronic component may include: a printed circuit board having a plurality of electrode pads disposed thereon; the composite electronic component as described above, mounted on the printed circuit board; and a solder connecting the electrode pads and the composite electronic component to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Composite Electronic Component

Figure 1:
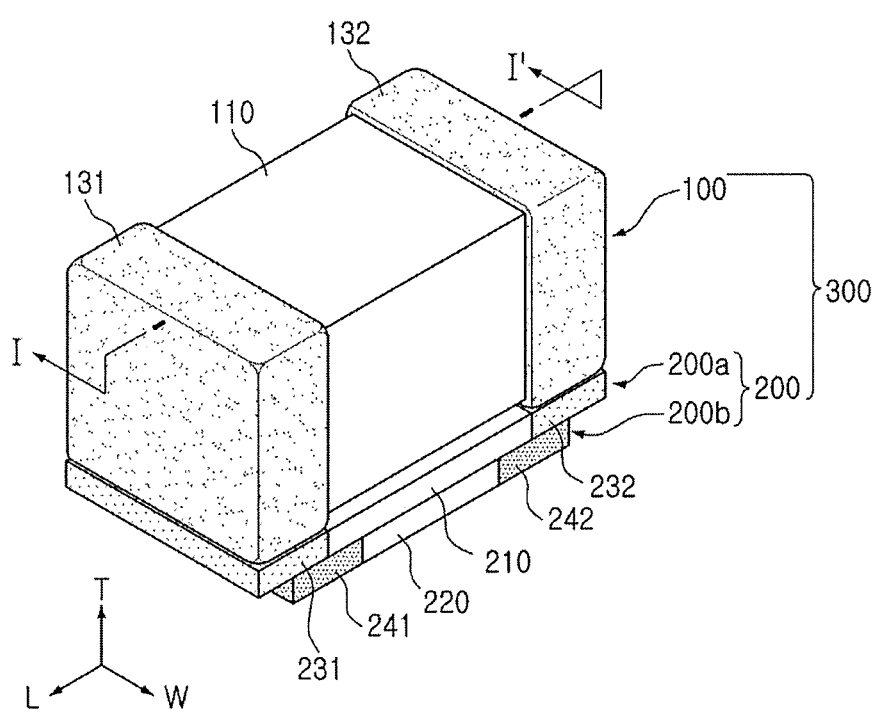
FIG. 1 is a perspective view schematically illustrating a composite electronic component according to a first exemplary embodiment in the present disclosure.

FIG. 1 is a perspective view schematically illustrating a composite electronic component according to a first exemplary embodiment in the present disclosure.

Figure 2:
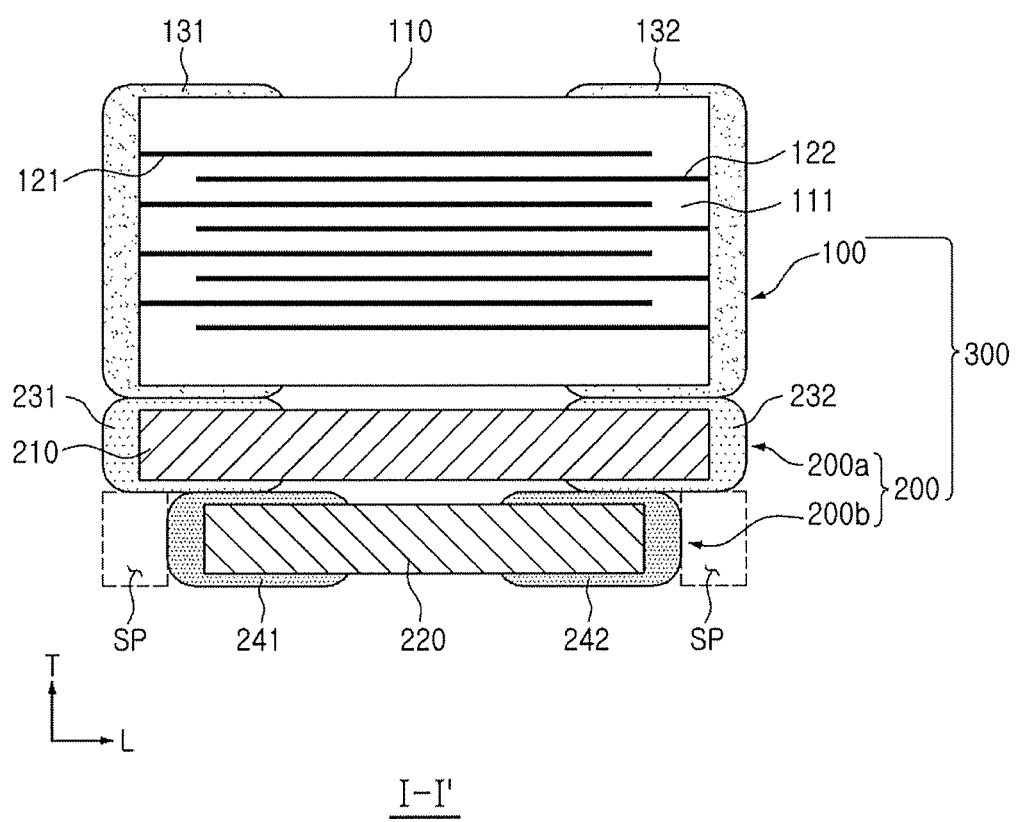
FIG. 2 is a cross-sectional view taken along line I-I' of FIG. 1.

FIG. 2 is a cross-sectional view taken along line I-I' of FIG. 1.

Referring to FIG. 1, in the composite electronic component according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1.

Meanwhile, in the exemplary embodiment in the present disclosure, the composite electronic component may have upper and lower surfaces opposing each other, first and second end surfaces in the length direction and third and fourth side surfaces in the width direction that connect the upper and lower surfaces to each other. A shape of the composite electronic component is not particularly limited, but may be a hexahedral shape as illustrated.

In addition, the first and second end surfaces of the composite electronic component in the length direction and the third and fourth side surfaces thereof in the width direction may be defined as surfaces in the same directions as directions of first and second end surfaces of the multilayer ceramic capacitor and the ceramic chip in the length direction and third and fourth side surfaces of the multilayer ceramic capacitor and the ceramic chip in the width direction, respectively, as described below.

Meanwhile, in the composite electronic component, the multilayer ceramic capacitor and the ceramic chip may be coupled to each other, and in a case in which the ceramic chip is coupled to a lower portion of the multilayer ceramic capacitor, the upper surface of the composite electronic component may be defined as an upper surface of the multilayer ceramic capacitor, and a lower surface of the composite electronic component may be defined as a lower surface of the ceramic chip.

Referring to FIGS. 1 and 2, the composite electronic component according to the first exemplary embodiment in the present disclosure may include a composite body 300 in which a multilayer ceramic capacitor 100 and a ceramic chip 200 are coupled to each other, wherein the multilayer ceramic capacitor 100 includes a body 110 in which a plurality of dielectric layers and internal electrodes 121 and 122 disposed to face each other with respective dielectric layers interposed therebetween are stacked, and first and second external electrodes 131 and 132 disposed on both end portions of the body 110, and the ceramic chip 200 is disposed on a lower portion of the multilayer ceramic capacitor 100.

According to the exemplary embodiment in the present disclosure, the ceramic chip 200 may have a double step shape formed by coupling two ceramic chips 200a and 200b having different lengths to each other in the thickness direction.

The ceramic chip 200 may be composed of a first ceramic chip 200a coming in contact with the multilayer ceramic capacitor 100 and a second ceramic chip 200b disposed on a lower portion of the first ceramic chip 200a.

The first ceramic chip 200a may include a first ceramic body 210 formed of a ceramic material and first and second terminal electrodes 231 and 232 disposed on both end portions of the first ceramic body 210 and connected to the first and second external electrodes 131 and 132.

Further, the second ceramic chip 200b may include a second ceramic body 220 formed of a ceramic material and third and fourth terminal electrodes 241 and 242 disposed on both end portions of the second ceramic body 220 and connected to the first and second terminal electrodes 231 and 232.

According to the related art, research into a composite electronic component in which a printed circuit board was used on a lower surface of a multilayer ceramic capacitor in order to decrease acoustic noise has been conducted.

However, in a case of increasing a thickness of the circuit board, an effect of reducing acoustic noise may be increased, but a side effect of decreasing electrical properties may occur. Therefore, research into a technology capable of efficiently reducing acoustic noise while significantly decreasing the thickness of the circuit board has been required.

According to the exemplary embodiment in the present disclosure, the ceramic chip 200 may be disposed on the lower portion of the multilayer ceramic capacitor 100 in order to reduce acoustic noise, but the ceramic chip 200 may have the double-step shape formed by coupling the ceramic chips 200a and 200b having different lengths to each other in the thickness direction, such that an effect of reducing acoustic noise may be more excellent as compared to a composite electronic component according to the related art in which a board is used on a lower surface of a multilayer ceramic capacitor.

Particularly, the effect of reducing acoustic noise may be excellent by adjusting the second ceramic chip 200b disposed in one portion of the ceramic chip 200 having the double-step shape to be adjacent to amounting surface of a printed circuit board to have a length shorter than that of the first ceramic chip 200a disposed in the other portion thereof.

That is, a step may be formed in order to form a space capable of being defined as a solder pocket between the multilayer ceramic capacitor 100 and the ceramic chip 200, and the solder pocket may block a solder from being formed in the thickness direction of the multilayer ceramic capacitor 100, such that the transferring of vibrations to the printed circuit board by the solder may be significantly decreased.

In detail, referring to FIG. 2, when the length of the second ceramic chip 200b disposed in one portion of the ceramic chip 200 having the double-step shape to be adjacent to the mounting surface of the printed circuit board is shorter than that of the first ceramic chip 200a disposed in the other portion thereof, the step may be formed, and the space capable of being defined as the solder pocket (SP) may be formed between the first and second ceramic chips 200a and 200b in the thickness direction.

In this case, in a case of mounting the composite electronic component according to the exemplary embodiment in the present disclosure on a printed circuit board and applying a solder, as the solder may be mostly filled in the solder pocket (SP), the remaining solder may be applied to lower surfaces of the first and second external electrodes 131 and 132 of the multilayer ceramic capacitor 100 and side surfaces of the first and second terminal electrodes 231 and 232 of the first ceramic chip 200a.

Since an amount of the solder applied onto the lower surfaces of the first and second external electrodes 131 and 132 of the multilayer ceramic capacitor 100 and the side surfaces of the first and second terminal electrodes 231 and 232 of the first ceramic chip 200a is smaller than that in a structure according to the related art, the transferring of vibration to the printed circuit board by the solder may be significantly decreased.

Hereinafter, the multilayer ceramic capacitor 100 and the ceramic chip 200 configuring the composite body 300 will be described in detail.

Referring to FIG. 2, the body 110 configuring the multilayer ceramic capacitor 100 may be formed by stacking the plurality of dielectric layers 111, and a plurality of internal electrodes 121 and 122 (sequentially first and second internal electrodes) may be disposed in the body 110 to be separated from each other with respective dielectric layers 111 interposed therebetween.

The plurality of dielectric layers 111 configuring the body 110 may be in a sintered state, and adjacent dielectric layers may be integrated with each other so that boundaries therebetween are not readily apparent.

The dielectric layer 111 may be formed by sintering a ceramic green sheet containing a ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

That is, the dielectric layer 111 configuring the body 110 may contain a ferroelectric material, but is not necessarily limited thereto.

Meanwhile, according to the first exemplary embodiment in the present disclosure, the internal electrodes may include first internal electrodes 121 exposed to the first end surface of the composite body 300 in the length direction and second internal electrodes 122 exposed to the second end surface thereof in the length direction, but the internal electrodes are not limited thereto.

The first and second internal electrodes 121 and 122 may be formed of a conductive paste containing a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layers 111, using the conductive paste by a printing method such as screen printing method or a gravure printing method.

The body 110 may be formed by alternately stacking and sintering the ceramic green sheet on which the internal electrode printed thereon.

The plurality of first and second internal electrodes 121 and 122 may be disposed to be horizontal to the upper and lower surfaces of the body 110.

Meanwhile, the first and second external electrodes 131 and 132 may be formed of a conductive paste including a conductive metal, wherein the conductive metal may be nickel (Ni), copper (Cu), palladium (Pd), gold (Au), or alloys thereof, but is not limited thereto.

Further, nickel/tin (Ni/Sn) plating layers may be further disposed on the first and second external electrodes 131 and 132.

According to the first exemplary embodiment in the present disclosure, the ceramic chip 200 may be coupled to the lower portion of the multilayer ceramic capacitor 100 to thereby be disposed thereon.

The ceramic chip 200 may include the first ceramic chip 200a in which the first and second terminal electrodes 231 and 232 connected to the first and second external electrodes 131 and 132 are disposed on both end portions of the first ceramic body 210 formed of a bulk shaped ceramic material.

Further, the ceramic chip 200 may include the second ceramic chip 200b in which the third and fourth terminal electrodes 241 and 242 connected to the first and second terminal electrodes 231 and 232 are disposed on both end portions of the second ceramic body 220 formed of a bulk shaped ceramic material.

The first and second ceramic bodies 210 and 220 may be formed of a ceramic material containing alumina ($Al_2O_3$).

More specifically, the first and second ceramic bodies 210 and 220 may be formed using alumina ($Al_2O_3$) and an insulating resin, wherein the insulating resin may be a thermosetting resin such as epoxy, or the like.

In general, in order to significantly decrease the transferring of vibration of a multilayer ceramic capacitor to a printed circuit board, there was an attempt to insert an intermediate medium between the multilayer ceramic capacitor and the printed circuit board.

However, since the intermediate medium is formed of a material having elasticity as a resin generally used to manufacture a board, the intermediate medium may serve to absorb vibrations of the multilayer ceramic capacitor through elasticity of the intermediate medium.

On the contrary, according to the first exemplary embodiment in the present disclosure, since the second ceramic body 210 of the ceramic chip 200 is formed of only a hard ceramic material that is not elastically deformed, the printed circuit board and the multilayer ceramic capacitor 100 may be spaced apart from each other by the ceramic chip 200, thereby blocking vibration itself generated in the multilayer ceramic capacitor 100 from being transferred.

In addition, since the solder may be mostly filled in the solder pocket (SP) formed by adjusting the second ceramic chip 200b disposed in one portion of the ceramic chip 200 having the double-step shape to be adjacent to the mounting surface of the printed circuit board to have a length shorter than that of the first ceramic chip 200a disposed in the other portion thereof, the effect of reducing acoustic noise may be more excellent.

Although not particularly limited, the first and second terminal electrodes 231 and 232 and the third and fourth terminal electrodes 241 and 242 may have, for example, a double layer structure composed of first and second conductive resin layers at inner portions thereof and first and second plating layers at outer portions thereof.

According to the first exemplary embodiment in the present disclosure, since the first and second terminal electrodes 231 and 232 have the double layer structure composed of the first and second conductive resin layers at the inner portions thereof and the first and second plating layers at the outer portions thereof, when mechanical stress is applied thereto from the outside, the ceramic chip 200 and the conductive resin layers used as the terminal electrodes 231, 232, 241, and 242 of the ceramic chip 200 may suppress stress from being transferred to the multilayer ceramic capacitor 100, thereby preventing the multilayer ceramic capacitor from being damaged by cracks.

The first and second conductive resin layers may contain a conductive metal and a thermosetting resin, for example, silver (Ag) and an epoxy resin, but are not limited thereto.

Figure 3:
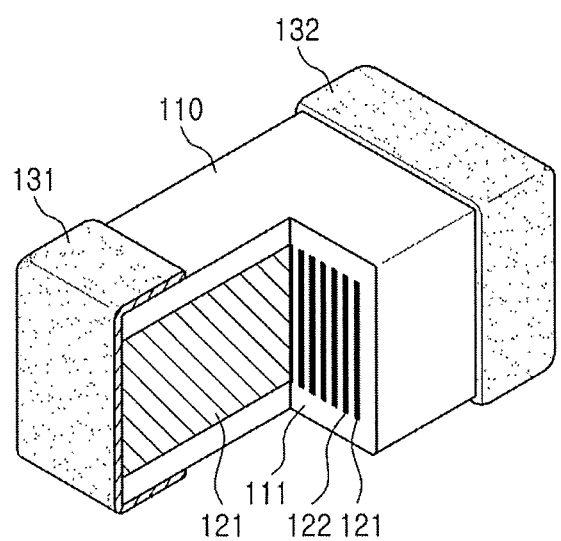
FIG. 3 is a partially cutaway perspective view schematically illustrating a multilayer ceramic capacitor according to a second exemplary embodiment of the composite electronic component of FIG. 1.

FIG. 3 is a partially cutaway perspective view schematically illustrating a multilayer ceramic capacitor according to a second exemplary embodiment in the present disclosure in the composite electronic component of FIG. 1.

Figure 4:
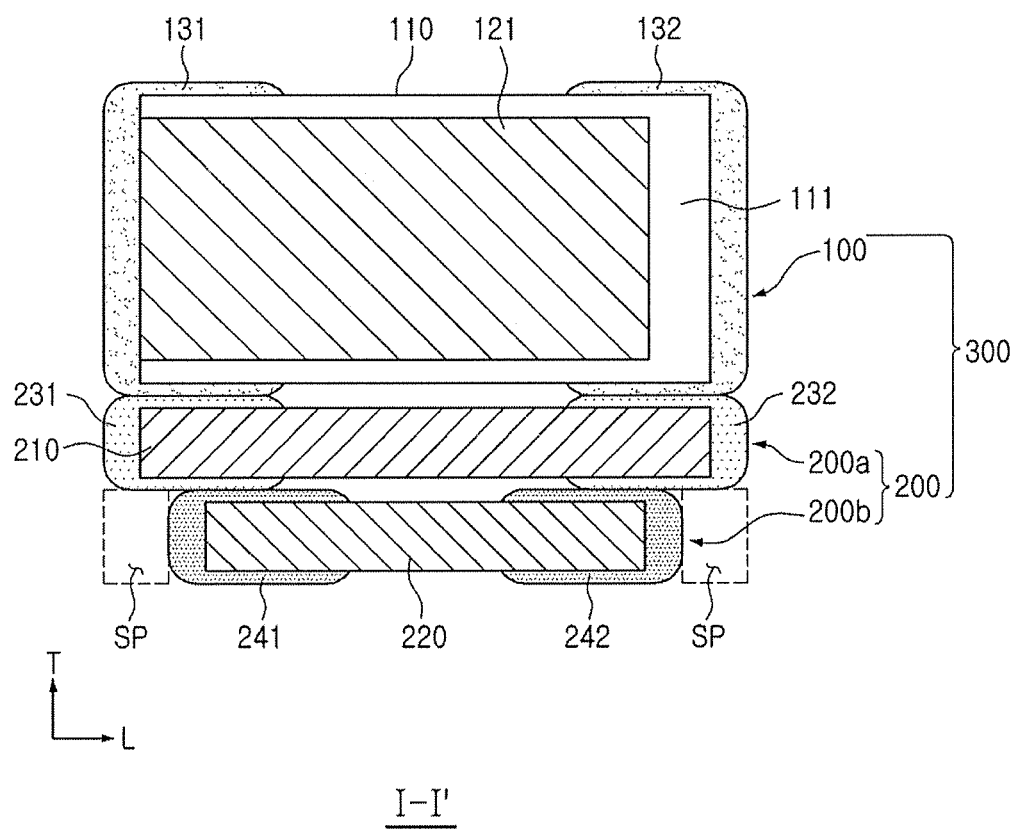
FIG. 4 is a cross-sectional diagram taken along the line I-I' of FIG. 1 according to the second exemplary embodiment in FIG. 3.

FIG. 4 is a cross-sectional diagram taken along the line I-I' of FIG. 1 according to a second exemplary embodiment in the present disclosure.

Referring to FIGS. 3 and 4, in the multilayer ceramic capacitor according to the second exemplary embodiment in the present disclosure, a plurality of first and second internal electrodes 121 and 122 may be disposed to be perpendicular to upper and lower surfaces of a body 110.

That is, the first and second internal electrodes 121 and 122 may be stacked to be perpendicular to amounting surface of the composite body 300 at the time of mounting the composite body 300 on a printed circuit board.

In general, when a voltage is applied to a multilayer ceramic capacitor, a ceramic body may be repeatedly expanded and contracted in length, width, and thickness directions due to an inverse piezoelectric effect of dielectric layers.

That is, in a case of actually measuring displacement amounts of a surface (LW surface) of the ceramic body in a length-width direction, a surface (WT surface) of the ceramic body in a width-thickness direction, and a surface (LT surface) of the ceramic body in a length-thickness direction using a laser doppler vibrometer (LDV), the displacement amount is decreased in a sequence of the LW surface, the WT surface, and the LT surface.

The displacement amount of the LT surface is about 42% or so, based on that of the WT surface, such that the displacement amount of the LT surface may be smaller than that of the WT surface. The reason may be that stress having the same magnitude is generated in the LT surface and the WT surface, but particularly, since the LT surface has a relatively wide area as compared to the WT surface, stress having a similar magnitude may be distributed throughout the wide area, such that relatively small deformation may occur.

Therefore, it may be appreciated that in the general multilayer ceramic capacitor, the displacement amount is the smallest in the LT surface.

That is, according to the first exemplary embodiment in the present disclosure, the first and second internal electrodes 121 and 122 may be stacked to be perpendicular to the upper and lower surfaces of the body 110, such that at the time of mounting the composite body 300 on the printed circuit board, the first and second internal electrodes 121 and 122 may be disposed to be perpendicular to the mounting surface, thereby significantly decreasing a vibration amount of a surface of the body 110 coming in contact with the ceramic chip 200.

In addition, since the solder may be mostly filled in the solder pocket (SP) formed by adjusting the second ceramic chip 200b disposed in one portion of the ceramic chip 200 having the double-step shape to be adjacent to the mounting surface of the printed circuit board to have a length shorter than that of the first ceramic chip 200a disposed in the other portion of, the effect of reducing acoustic noise may be more excellent.

Figure 5:
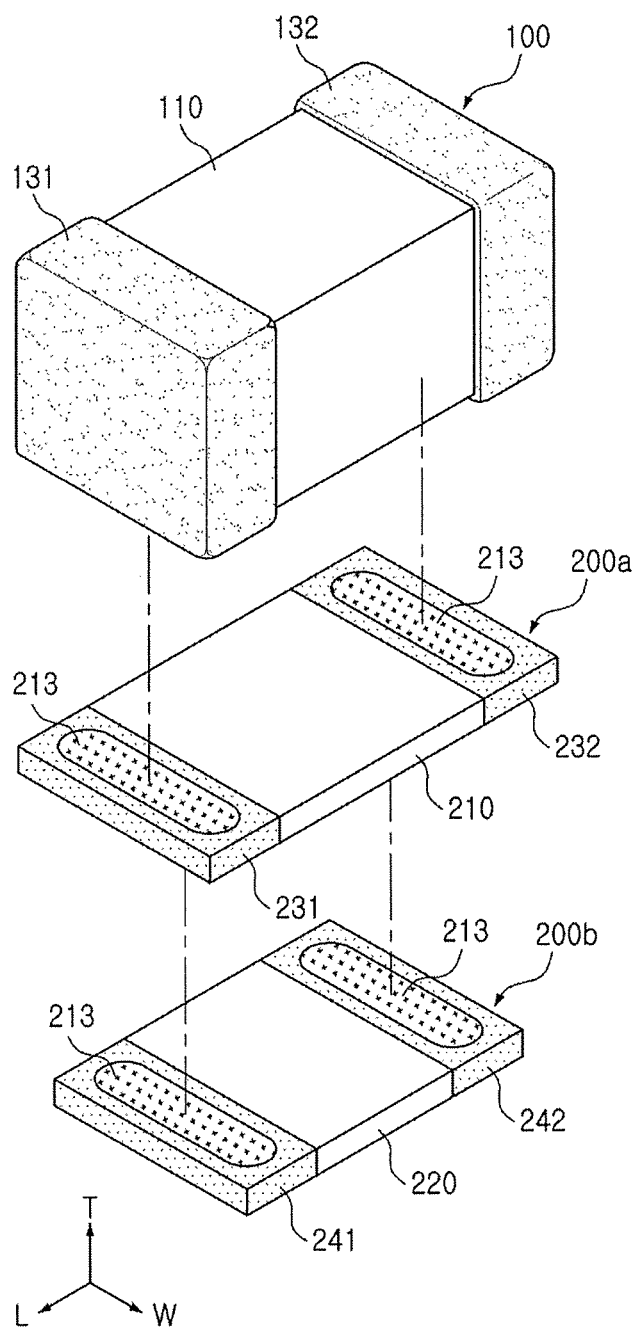
FIG. 5 is an exploded perspective view separately illustrating a multilayer ceramic capacitor and a ceramic chip of the composite electronic component of FIG. 1.

FIG. 5 is an exploded perspective view separately illustrating the multilayer ceramic capacitor 100 and the ceramic chip 200 of the composite electronic component of FIG. 1.

The composite body 300 may be formed by coupling the multilayer ceramic capacitor 100 and the ceramic chip 200 to each other, and a method of forming the composite body 300 is not particularly limited.

The composite body 300 may be formed by coupling the multilayer ceramic capacitor 100 and the ceramic chip 200 that are separately manufactured to each other using a high-melting point solder, a conductive adhesive 213, or the like.

The conductive adhesive 213 may be a paste containing a conductive metal and an epoxy resin, but is not necessarily limited thereto.

Referring to FIG. 5, in a case of coupling the multilayer ceramic capacitor 100 and the ceramic chip 200 using the conductive adhesive 213, the conductive paste 213 may be applied onto the lower surfaces of the first and second external electrodes 131 and 132 to thereby be adhered to the first and second terminal electrodes 231 and 232 of the first ceramic chip 200a.

The conductive adhesive 213 may be applied onto the lower surfaces of the first and second external electrodes 131 and 132 to thereby be fixed to the ceramic chip 200 at the lower surface of the multilayer ceramic capacitor 100, such that only vibration of the surface (LW surface) of the body 110 in the length-width direction may be transferred to the ceramic chip 200.

Therefore, the transferring of stress and vibration generated in the multilayer ceramic capacitor 100 to the ceramic chip 200 may be significantly decreased, such that acoustic noise may be reduced.

Meanwhile, the conductive adhesive 213 may be applied to lower surfaces of the first and second terminal electrodes 231 and 232 of the first ceramic chip 200a of the ceramic chip 200 to thereby be adhered to the third and fourth terminal electrodes 241 and 242 of the second ceramic chip 200b of the ceramic chip 200.

Therefore, the transferring of stress and vibration generated in the multilayer ceramic capacitor 100 to the ceramic chip 200 may be significantly decreased, such that acoustic noise may be reduced.

Figure 6:
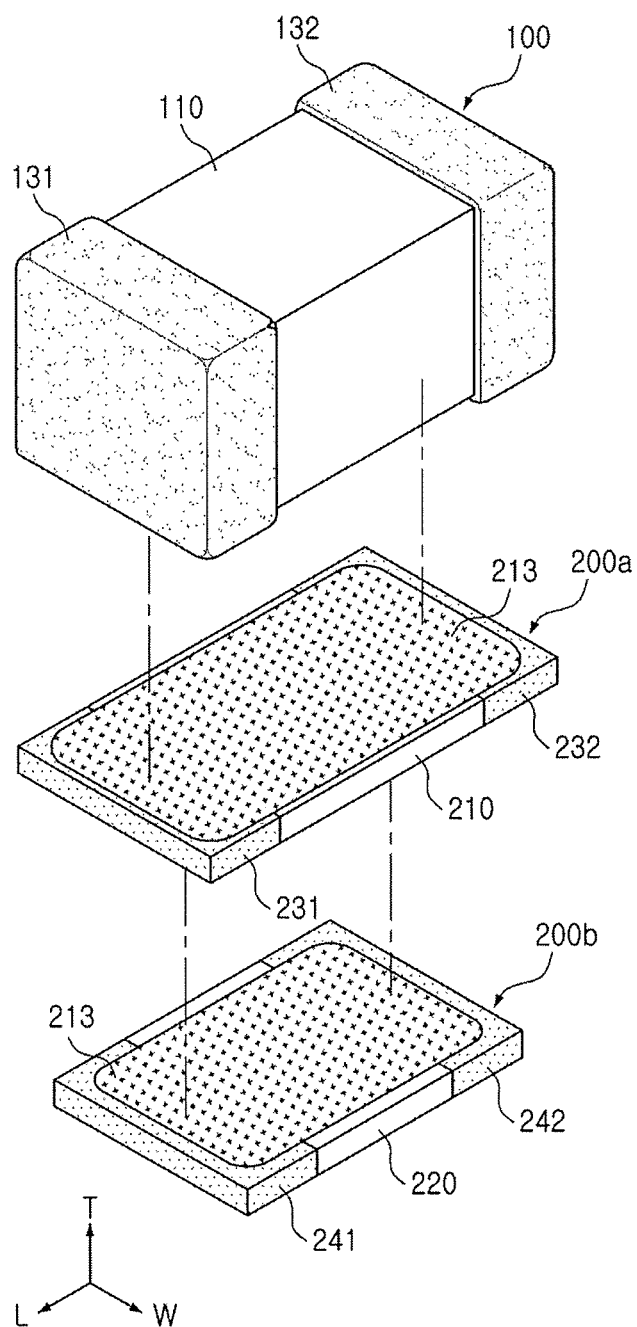
FIG. 6 is an exploded perspective view separately illustrating a multilayer ceramic capacitor and a ceramic chip of another example of the composite electronic component of FIG. 1.

FIG. 6 is an exploded perspective view separately illustrating the multilayer ceramic capacitor 100 and the ceramic chip 200 of another example of the composite electronic component of FIG. 1.

Referring to FIG. 6, the high-melting point solder or the conductive adhesive 213 may be applied to the entire upper surface of the ceramic chip 200, which is an adhesion surface thereof adhered to the multilayer ceramic capacitor 100, to thereby be fixed to the ceramic chip 200 at the lower surface of the multilayer ceramic capacitor 100.

In a case in which the conductive adhesive 213 is applied to the entire upper surface of the ceramic chip 200, the adhesion surface of the ceramic chip 200 adhered to the multilayer ceramic capacitor 100, as described above, the effect of reducing acoustic noise may be more excellent due to elasticity of the conductive adhesive 213.

Further, since the adhesive is applied to the entire adhesion surface, at the time of mounting the composite electronic component in a board, binding strength of the composite electronic component may be improved, such that reliability may be improved.

Meanwhile, the conductive adhesive 213 may be applied to an entire lower surface of the first ceramic chip 200a of the ceramic chip 200 or an entire upper surface of the second ceramic chip 200b of the ceramic chip 200 to thereby adhere the first and second ceramic chips 200a and 200b to each other.

In this case, the effect of reducing acoustic noise may be more excellent due to elasticity of the conductive adhesive 213.

Figure 7:
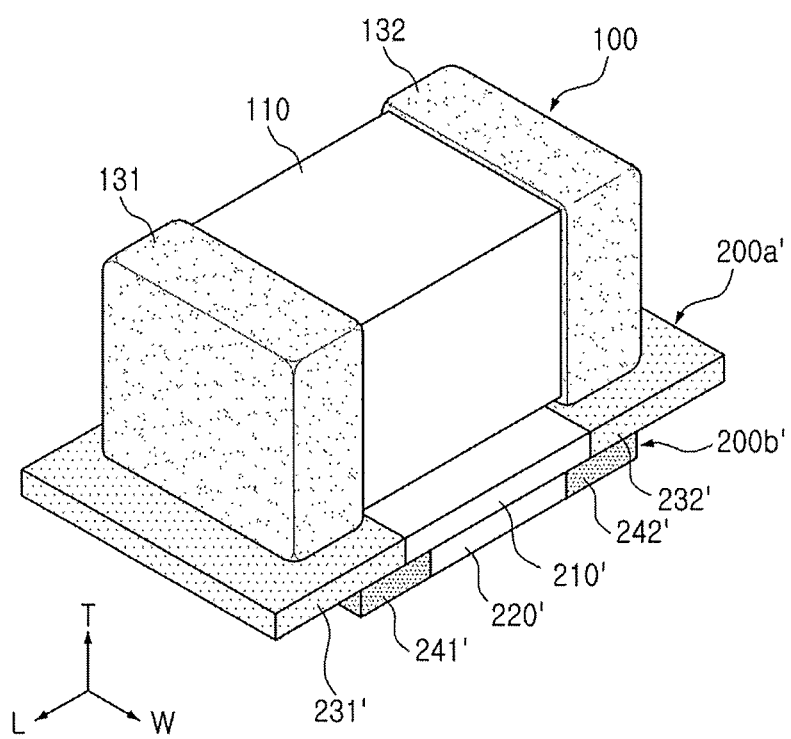
FIG. 7 is a perspective view schematically illustrating a composite electronic component according to a third exemplary embodiment of the present disclosure.

FIG. 7 is a perspective view schematically illustrating a composite electronic component according to a third exemplary embodiment of the present disclosure.

Referring to FIG. 7, in the composite electronic component according to the third exemplary embodiment in the present disclosure, a length of a first ceramic chip 200a' of a ceramic chip may be longer than that of a multilayer ceramic capacitor 100, and a width of the first ceramic chip 200a' may be wider than that of the multilayer ceramic capacitor 100.

The ceramic chip 200 may be composed of a first ceramic chip 200a' coming in contact with the multilayer ceramic capacitor 100 and a second ceramic chip 200b' disposed on a lower portion of the first ceramic chip 200a'.

The first ceramic chip 200a' may include a first ceramic body 210' formed of a ceramic material and first and second terminal electrodes 231' and 232' disposed on both end portions of the first ceramic body 210' and connected to first and second external electrodes 131 and 132.

Further, the second ceramic chip 200b' may include a second ceramic body 220' formed of a ceramic material and third and fourth terminal electrodes 241' and 242' disposed on both end portions of the second ceramic body 220' and connected to the first and second terminal electrodes 231' and 232'.

Since the length of the first ceramic chip 200a' is longer than that of the multilayer ceramic capacitor 100, and the width of the first ceramic chip 200a' is wider than that of the multilayer ceramic capacitor 100, at the time of mounting the composite electronic component on a printed circuit board, the first ceramic chip 200a' may serve to block a solder from being connected up to the multilayer ceramic capacitor 100 in length and width directions of the multilayer ceramic capacitor 100.

Therefore, the transferring of vibration to the printed circuit board by the solder may be further decreased.

A length and a width of the second ceramic chip 200b' may be increased in proportion to the length and the width of the first ceramic chip 200a'.

Alternatively, the length and the width of the second ceramic chip 200b' may be the same as those of the second ceramic chip 200b of the composite electronic component according to the first exemplary embodiment in the present disclosure, In this case, since a space of a solder pocket is increased, an effect of blocking the solder from being connected to the multilayer ceramic capacitor 100 may be more excellent.

Figure 8:
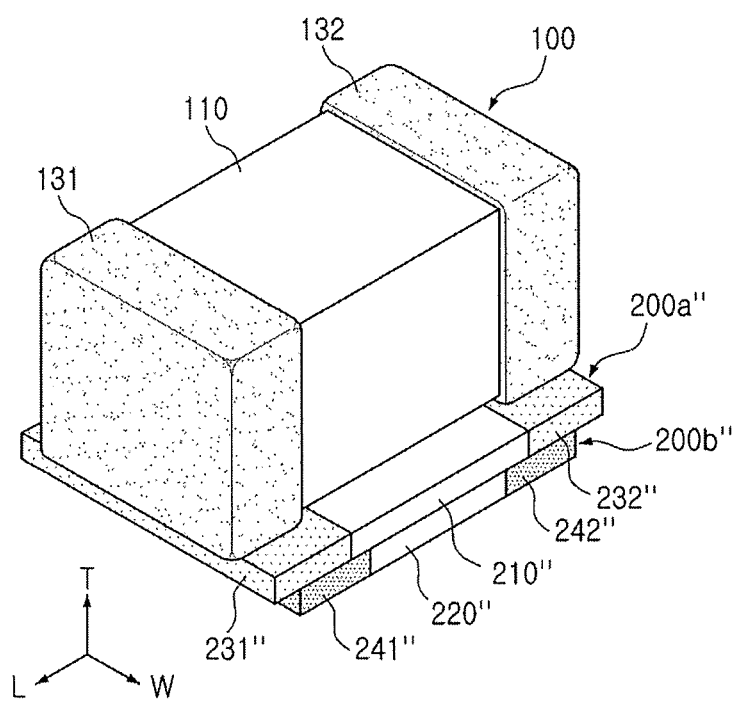
FIG. 8 is a perspective view schematically illustrating a composite electronic component according to a fourth exemplary embodiment in the present disclosure.

FIG. 8 is a perspective view schematically illustrating a composite electronic component according to a fourth exemplary embodiment in the present disclosure.

Referring to FIG. 8, in the composite electronic component according to the fourth exemplary embodiment in the present disclosure, a length of a first ceramic chip 200a" of a ceramic chip may be shorter than that of a multilayer ceramic capacitor 100, and a width of the first ceramic chip 200a" may be wider than that of the multilayer ceramic capacitor 100.

The ceramic chip may be composed of a first ceramic chip 200a" coming in contact with the multilayer ceramic capacitor 100 and a second ceramic chip 200b" disposed on a lower portion of the first ceramic chip 200a".

The first ceramic chip 200a" may include a first ceramic body 210" formed of a ceramic material and first and second terminal electrodes 231" and 232" disposed on both end portions of the first ceramic body 210" and connected to first and second external electrodes 131 and 132.

Further, the second ceramic chip 200b" may include a second ceramic body 220" formed of a ceramic material and third and fourth terminal electrodes 241" and 242" disposed on both end portions of the second ceramic body 220" and connected to the first and second terminal electrodes 231" and 232".

Since the length of the first ceramic chip 200a" is shorter than that of the multilayer ceramic capacitor 100, and the width of the first ceramic chip 200a" is wider than that of the multilayer ceramic capacitor 100, at the time of mounting the composite electronic component on a printed circuit board, the first ceramic chip 200" may serve to allow solder to be applied only up to lower surfaces of the first and second external electrodes 131 and 132 in a length direction of the multilayer ceramic capacitor 100 and block the solder from being connected up to the multilayer ceramic capacitor 100 due to a step.

That is, since the length of the first ceramic chip 200a" is shorter than that of the multilayer ceramic capacitor 100, a so-called solder pocket blocking the solder from rising up to the first and second external electrodes 131 and 132 in the length direction of the multilayer ceramic capacitor 100 may be formed between the multilayer ceramic capacitor 100 and the first ceramic chip 200a" and between the first and second ceramic chips 200a" and 200b".

In this structure, at the time of mounting the composite electronic component on a printed circuit board, the solder may be applied only up to the lower surfaces of the first and second external electrodes 131 and 132 in the length direction of the multilayer ceramic capacitor 100.

Therefore, the transferring of vibration to the printed circuit board by the solder may be further decreased.

Figure 9:
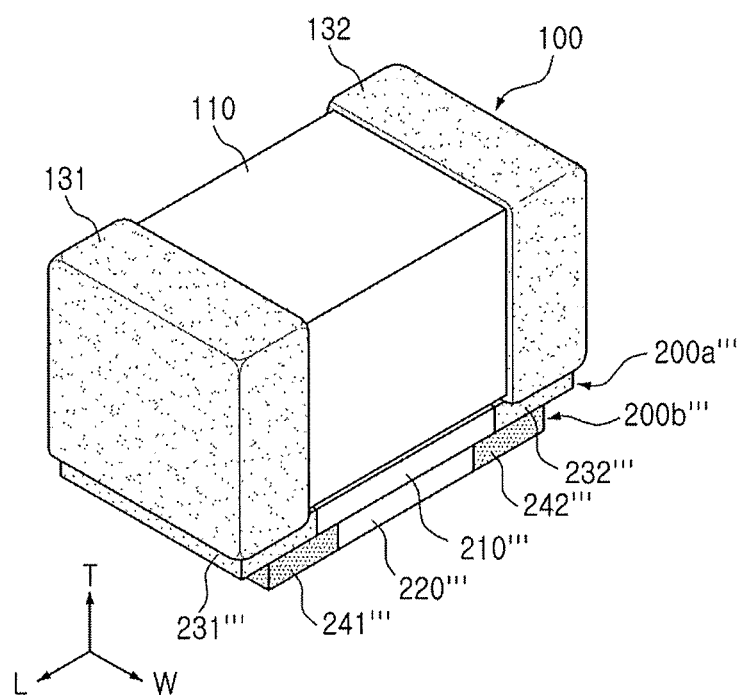
FIG. 9 is a perspective view schematically illustrating a composite electronic component according to a fifth exemplary embodiment in the present disclosure.

FIG. 9 is a perspective view schematically illustrating a composite electronic component according to a fifth exemplary embodiment in the present disclosure.

Referring to FIG. 9, in the composite electronic component according to the fifth exemplary embodiment in the present disclosure, a length of a first ceramic chip 200a''' of a ceramic chip may be shorter than that of a multilayer ceramic capacitor 100, and a width of the first ceramic chip 200a''' may be narrower than that of the multilayer ceramic capacitor 100.

The ceramic chip may be composed of a first ceramic chip 200a''' coming in contact with the multilayer ceramic capacitor 100 and a second ceramic chip 200b''' disposed on a lower portion of the first ceramic chip 200a'''.

The first ceramic chip 200a''' may include a first ceramic body 210''' formed of a ceramic material and first and second terminal electrodes 231''' and 232''' disposed on both end portions of the first ceramic body 210''' and connected to first and second external electrodes 131 and 132.

Further, the second ceramic chip 200b''' may include a second ceramic body 220''' formed of a ceramic material and third and fourth terminal electrodes 241''' and 242''' disposed on both end portions of the second ceramic body 220''' and connected to the first and second terminal electrodes 231''' and 232'''.

Since the length of the first ceramic chip 200a''' is shorter than that of the multilayer ceramic capacitor 100, and the width of the first ceramic chip 200a''' is narrower than that of the multilayer ceramic capacitor 100, at the time of mounting the composite electronic component on a printed circuit board, the first ceramic chip 200''' may serve to allow the solder to be applied only up to lower surfaces of the first and second external electrodes 131 and 132 in length and width directions of the multilayer ceramic capacitor 100, and block the solder from being connected up to the multilayer ceramic capacitor 100 in a thickness direction thereof.

That is, since the length of the first ceramic chip 200a''' is shorter than that of the multilayer ceramic capacitor 100, a so-called solder pocket blocking the solder from rising up to the first and second external electrodes 131 and 132 in the length direction of the multilayer ceramic capacitor 100 may be formed between the multilayer ceramic capacitor 100 and the first ceramic chip 200a''' and between the first and second ceramic chips 200a''' and 200b'''.

Therefore, the transferring of vibration to the printed circuit board by the solder may be further decreased.

Figure 10:
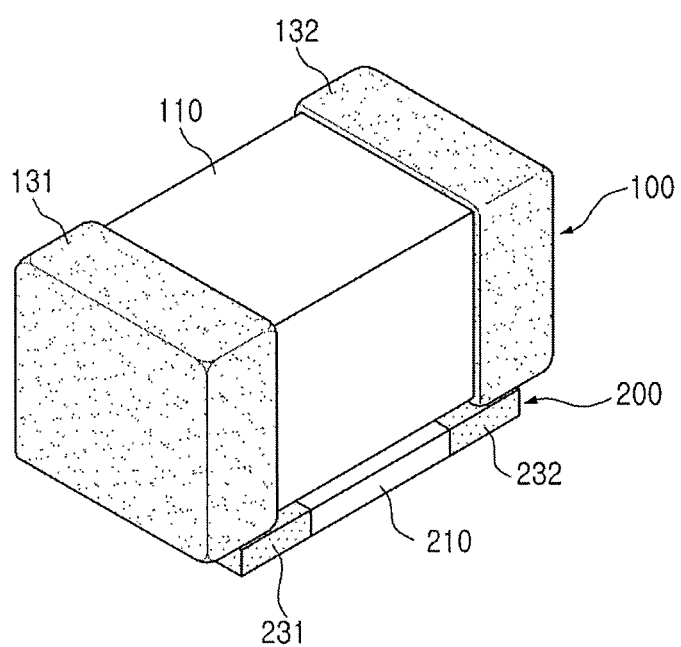
FIG. 10 is a perspective view schematically illustrating a composite electronic component according to a sixth exemplary embodiment in the present disclosure.

FIG. 10 is a perspective view schematically illustrating a composite electronic component according to a sixth exemplary embodiment in the present disclosure.

Referring to FIG. 10, in the composite electronic component according to the sixth embodiment in the present disclosure, a length of a ceramic chip 200 may be shorter than a length of the multilayer ceramic capacitor 100.

The ceramic chip 200 may include a first ceramic body 210 formed of a ceramic material and first and second terminal electrodes 231 and 232 disposed on both end portions of the first ceramic body 210 and connected to first and second external electrodes 131 and 132.

Since the length of the ceramic chip 200 is shorter than the length of the multilayer ceramic capacitor 100, at the time of mounting the composite electronic component on a printed circuit board, the solder may be applied only up to the lower surfaces of the first and second external electrodes 131 and 132 in a length direction of the multilayer ceramic capacitor 100, and the ceramic chip 200 may serve to block the solder from being connected to the multilayer ceramic capacitor 100 due to a step.

That is, since the length of the ceramic chip 200 is shorter than that of the multilayer ceramic capacitor 100, a so-called solder pocket blocking the solder from rising up to the first and second external electrodes 131 and 132 in the length direction of the multilayer ceramic capacitor 100 may be formed between the multilayer ceramic capacitor 100 and the ceramic chip 200.

In this structure, at the time of mounting the composite electronic component on a printed circuit board, the solder may be applied only up to the lower surfaces of the first and second external electrodes 131 and 132 in the length direction of the multilayer ceramic capacitor 100.

Therefore, the transferring of vibration to the printed circuit board by the solder may be further decreased.

Board Having Composite Electronic Component

Figure 11:
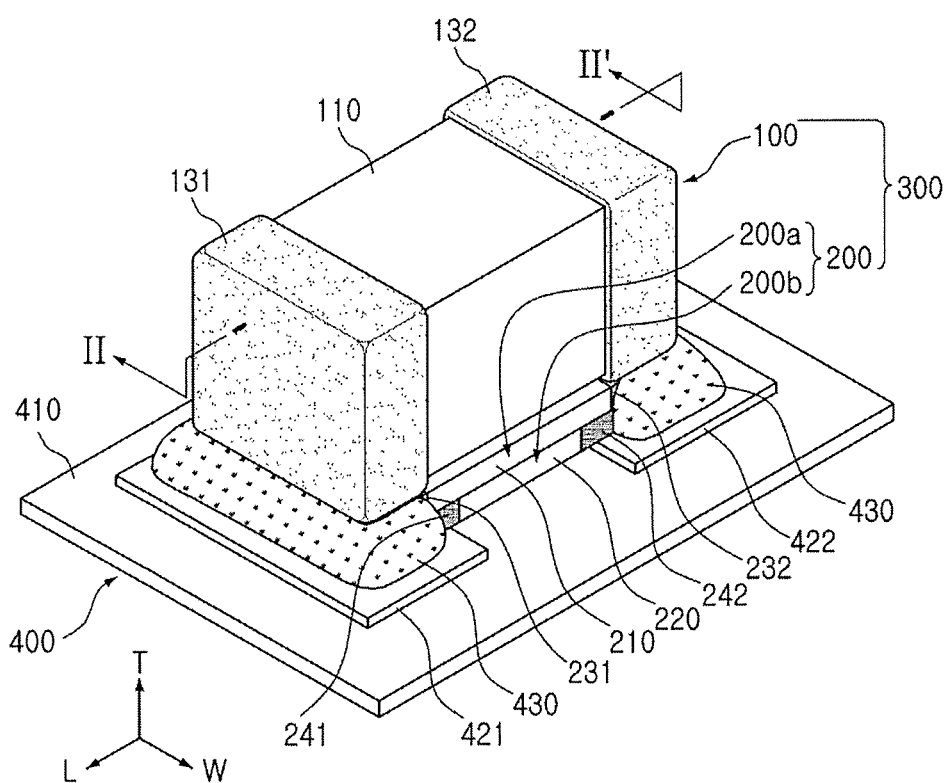
FIG. 11 is a perspective view illustrating a board in which the composite electronic component of FIG. 1 is mounted on a printed circuit board.

FIG. 11 is a perspective view illustrating a board in which the composite electronic component of FIG. 1 is mounted on a printed circuit board.

Figure 12:
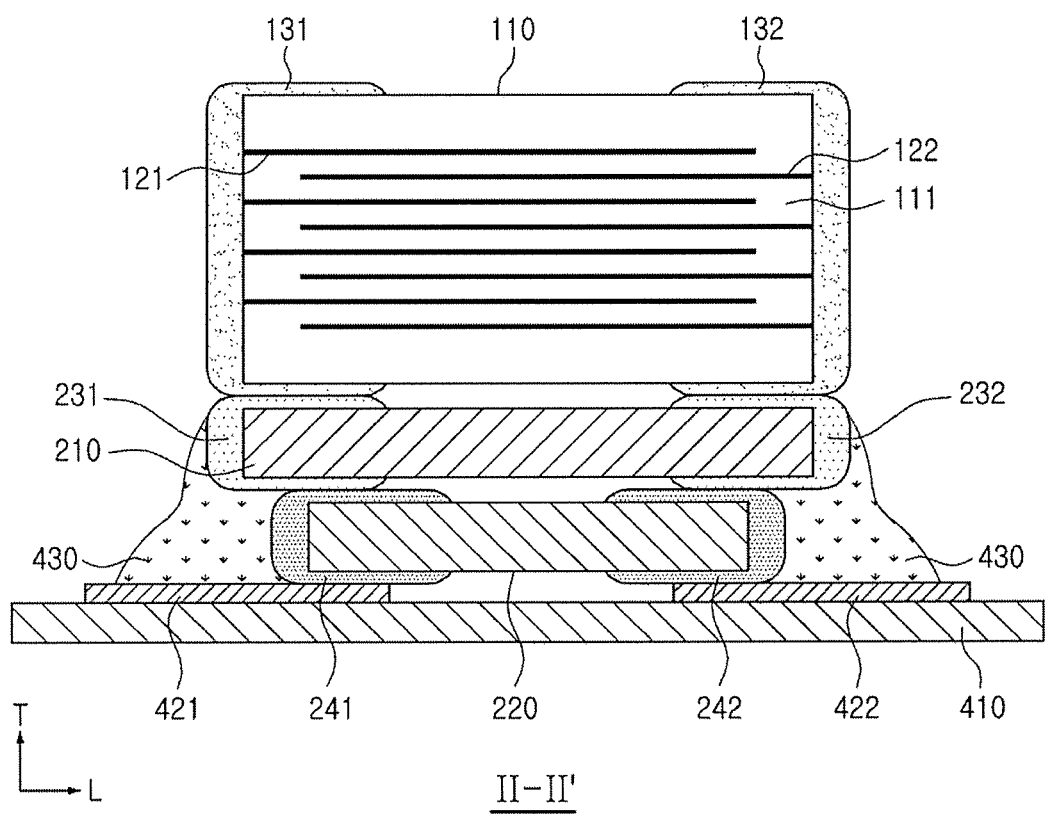
FIG. 12 is a cross-sectional view taken along line II-II' of FIG. 11.

FIG. 12 is a cross-sectional view taken along line II-II' of FIG. 11.

Referring to FIGS. 11 and 12, a board 400 having a composite electronic component according to the present exemplary embodiment may include a printed circuit board 410 on which the composite electronic component is mounted and two electrode pads 421 and 422 formed on an upper surface of the printed circuit board 410.

The electrode pads 421 and 422 may be composed of first and second electrode pads 421 and 422 electrically connected to the first and second terminal electrodes 231 and 232 of the ceramic chip 200 of the composite electronic component, respectively.

In this case, the first and second terminal electrodes 231 and 232 of the ceramic chip 200 may be electrically connected to the printed circuit board 410 by solder 430 in a state in which third and fourth terminal electrodes 241 and 242 are positioned to contact the first and second electrode pads 421 and 422, respectively.

When a voltage is applied in a state in which the composite electronic component is mounted on the printed circuit board 410 as described above, acoustic noise may be generated.

That is, when voltages having different polarities are applied to the first and second external electrodes 131 and 132 disposed on both end surfaces of the multilayer ceramic capacitor 100 of the composite electronic component in the length direction in a state in which the composite electronic component is mounted on the printed circuit board 410, a ceramic body may be expanded and contracted in the thickness direction by an inverse piezoelectric effect of the dielectric layer 111, and both side portions of the first and second external electrodes 131 and 132 may be contracted and expanded by a Poisson effect as opposed to expansion and contraction of the first ceramic body in the thickness direction.

Here, in the composite electronic component according to the exemplary embodiment in the present disclosure, since the length of the second ceramic chip 200b disposed in one portion of the ceramic chip 200 having the double-step shape to be adjacent to a mounting surface of the printed circuit board 410 is shorter than that of the first ceramic chip 200a disposed in the other portion thereof, the solder pocket (SP) may be formed between the first and second ceramic chips 200a and 200b in the thickness direction. Due to this solder pocket (SP), the transferring of the vibration to the printed circuit board 410 by the solder may be significantly decreased by blocking the solder from being formed in the thickness direction of the multilayer ceramic capacitor 100.

That is, referring to FIG. 12, at the time of mounting the composite electronic component according to the exemplary embodiment in the present disclosure on the printed circuit board 410, even though an amount of the solder is large, as the solder may be mostly filled in the solder pocket (SP), the remaining solder may be applied to lower surfaces of the first and second external electrodes 131 and 132 of the multilayer ceramic capacitor 100 and side surfaces of the first and second terminal electrodes 231 and 232 of the first ceramic chip 200a.

Since an amount of the solder applied onto the lower surfaces of the first and second external electrodes 131 and 132 of the multilayer ceramic capacitor 100 and the side surfaces of the first and second terminal electrodes 231 and 232 of the first ceramic chip 200a is smaller than that in a structure according to the related art, the transferring of vibration to the printed circuit board 410 by the solder may be significantly decreased.

That is, at the time of mounting the composite electronic component on the printed circuit board 410, the transferring of vibrations of the capacitor due to the inverse piezoelectric property of the capacitor to the printed circuit board 410 may be decreased, such that acoustic noise may be reduced.

As set forth above, according to exemplary embodiments in the present disclosure, stress or vibrations due to the piezoelectric property of a multilayer ceramic capacitor may be alleviated by a ceramic chip, such that the acoustic noise generated in the printed circuit board may be reduced.

Particularly, according to the exemplary embodiment in the present disclosure, since the ceramic chip has the double-step shape formed by coupling two chips having different lengths to each other in the thickness direction, the effect of reducing acoustic noise may be more excellent as compared to the composite electronic component according to the related art.

That is, a space, so-called a solder pocket, may be formed between the multilayer ceramic capacitor and the ceramic chip, such that the transferring of vibration to the board by the solder may be significantly decreased by blocking the solder from being formed in the thickness direction of the multilayer ceramic capacitor.

Further, the internal electrodes of the multilayer ceramic capacitor may be stacked perpendicularly to the mounting surface of the composite body, and the surface of the body in the length-width direction of which a piezoelectric displacement amount is small may be adhered to the ceramic chip, such that the transferring of stress and vibration generated in the multilayer ceramic capacitor to the ceramic chip may be significantly decreased, thereby reducing acoustic noise.

In addition, the multilayer ceramic capacitor and the ceramic chip may be adhered to each other and the first and second ceramic chips in the double-step shape may be adhered to each other using the conductive adhesive, but the conductive adhesive is applied to the entire adhesion surface, such that the transferring of the vibration to the board may be significantly decreased due to elasticity of the conductive adhesive.

While exemplary embodiments have been shown and described above, it will be apparent to those skilled in the art that modifications and variations could be made without departing from the scope of the present invention as defined by the appended claims.

What is claimed is:

1. A composite electronic component comprising a composite body in which a multilayer ceramic capacitor and a ceramic chip are coupled to each other,
   the multilayer ceramic capacitor including a body having internal electrodes stacked to face each other and a plurality of dielectric layers each interposed therebetween, and first and second external electrodes disposed on both end portions of the body, and
   the ceramic chip being disposed on a lower portion of the multilayer ceramic capacitor,
   wherein the ceramic chip has a double-step shape and includes two ceramic chips having different lengths to each other and coupled in a thickness direction of the ceramic chip,
   wherein the ceramic chip includes a first ceramic chip disposed adjacent to the multilayer ceramic capacitor and a second ceramic chip disposed adjacent to a mounting surface of a printed circuit board, and
   wherein a length of the second ceramic chip is shorter than a length of the first ceramic chip.

2. The composite electronic component of claim 1, wherein the internal electrodes in the body are stacked to be perpendicular to a mounting surface of the composite body.

3. The composite electronic component of claim 1, wherein the first ceramic chip is in contact with the multilayer ceramic capacitor and the second ceramic chip is disposed on a lower portion of the first ceramic chip,
   the first ceramic chip includes a first ceramic body formed of a ceramic material and first and second terminal electrodes disposed on both end portions of the first ceramic body and connected to the first and second external electrodes, respectively, and
   the second ceramic chip includes a second ceramic body formed of a ceramic material and third and fourth terminal electrodes disposed on both end portions of the second ceramic body and connected to the first and second terminal electrodes, respectively.

4. The composite electronic component of claim 3, wherein the first and second ceramic chips are coupled to each other by a conductive adhesive.

5. The composite electronic component of claim 4, wherein the first and second terminal electrodes are coupled to the third and fourth terminal electrodes, respectively, by the conductive adhesive, and
   the first and second terminal electrodes are coupled to the first and second external electrodes, respectively, by the conductive adhesive.

6. The composite electronic component of claim 4, wherein the first and second ceramic chips are coupled to each other by the conductive adhesive applied to an entire adhesion surface thereof.

7. The composite electronic component of claim 3, wherein the length of the first ceramic chip is longer than a length of the multilayer ceramic capacitor.

8. The composite electronic component of claim 7, wherein a width of the first ceramic chip is wider than a width of the multilayer ceramic capacitor.

9. The composite electronic component of claim 3, wherein the length of the first ceramic chip is shorter than a length of the multilayer ceramic capacitor.

10. The composite electronic component of claim 3, wherein the length of the first ceramic chip is shorter than a length of the multilayer ceramic capacitor, and a width of the first ceramic chip is narrower than a width of the multilayer ceramic capacitor.

11. The composite electronic component of claim 1, wherein the multilayer ceramic capacitor and the ceramic chip are coupled to each other by a conductive adhesive.

12. The composite electronic component of claim 11, wherein the multilayer ceramic capacitor and the ceramic chip are coupled to each other by the conductive adhesive applied to an entire adhesion surface thereof.

13. A board having a composite electronic component, the board comprising:
   a printed circuit board having a plurality of electrode pads disposed thereon;
   the composite electronic component of claim 1, mounted on the printed circuit board; and
   a solder connecting the electrode pads and the composite electronic component to each other.

14. The board of claim 13, wherein the multilayer ceramic capacitor and the ceramic chip are coupled to each other by a conductive adhesive.

* * * * *